United States Patent [19]

Ashley et al.

[11] Patent Number: 5,528,630
[45] Date of Patent: Jun. 18, 1996

[54] COUPLER FOR COMMUNICATION SYSTEMS WHICH UTILIZE MORE THAN ONE FREQUENCY BAND

[75] Inventors: Francis R. Ashley, South Plainfield; Steven J. Daubert, Lincroft, both of N.J.

[73] Assignee: AT&T Corp., Murray Hill, N.J.

[21] Appl. No.: 230,263

[22] Filed: Apr. 20, 1994

[51] Int. Cl.⁶ .............................. H04B 3/00; H03H 7/38
[52] U.S. Cl. .................... 375/258; 375/220; 330/167; 330/189; 330/196; 333/32; 333/177
[58] Field of Search .................................... 375/220, 258, 375/377, 285; 330/165–167, 188–189, 195–196; 333/32, 177

[56] References Cited

U.S. PATENT DOCUMENTS

| | | | |
|---|---|---|---|
| 2,797,261 | 6/1957 | Polyzou | 375/334 |
| 4,896,349 | 1/1990 | Kubo et al. | 375/219 |
| 5,148,144 | 9/1992 | Sutterlin et al. | 375/258 |

OTHER PUBLICATIONS

John Cook, ANSI/TI, "Telephony Transmission and Splitters, Passive and Active", Doc. T1E1. 4/94–043, Feb. 14–18, 1994 (San Francisco Meeting), pp. 1–14.

Ken Hohhof, T1E1.4 Technical Subcommittee Working Group Members, "POTS Splitter Issues If Carrier #6 Is Used For Exchange", T1E1.4/94–018, Jan. 12, 1994, pp. 1–8.

Primary Examiner—Young T. Tse
Attorney, Agent, or Firm—Steven R. Bartholomew

[57] ABSTRACT

A signal coupler includes a transformer having a primary and a secondary winding. Each transformer winding has a pair of associated winding terminals and is also split at an intermediate winding position to form a pair of supplemental winding terminals. Circuitry is provided between each pair of supplemental winding terminals so as to provide different impedances in different frequency bands. In particular, a first circuit, which provides a first impedance in a first frequency range, is connected across the supplemental winding terminals of one winding. A second circuit, is connected across the supplemental winding terminals of the other transformer winding. This second circuit, in combination with the first, provides a second impedance in a second frequency range. In the disclosed embodiment, the first circuit provides an impedance of 600 ohms in the voiceband frequency range. The second circuit in combination with the first provides an impedance of 100 ohms in a frequency range extending above 40 kHz.

10 Claims, 4 Drawing Sheets

COUPLER FOR COMMUNICATION SYSTEMS WHICH UTILIZE MORE THAN ONE FREQUENCY BAND

TECHNICAL FIELD

The present invention relates to communication systems and, more particularly, to such systems in which information is communicated in more than one frequency band.

BACKGROUND OF THE INVENTION

In many communications systems, the information transmitted to the receiver is coupled through more than one frequency band. The information coupled in one frequency band may be of a different type or from a different source than that coupled in the other band. Voice information may be assigned to one frequency band while data is assigned to another. Or, for example, different types of data or data originating from different sources may be transmitted through different frequency bands. Or, for example, in frequency division multiplexing, a stream of information of one type or from one is source may be cyclic assigned to a particular band. In any event, in such system applications, there is a need for circuitry which inserts an information signal into and/or extracts a received information signal from a particular frequency band. We shall refer to such circuitry as a coupler.

Couplers can be provided using passive or active components. While passive components have long been used to provide the necessary coupling function, the performance objectives of certain communication system applications exceeds the capabilities of prior art couplers which utilize passive components. Couplers implemented with active devices, on the other hand, must be powered to function, and backup power capabilities must be provided in applications where it is required that the communication system continues to function during commercial power service interruptions. Providing this power backup capability adds an expense which cannot be tolerated in certain situations. It would, therefore, be desirable if the performance capabilities of a coupler implemented with passive devices could be enhanced.

SUMMARY OF THE INVENTION

To overcome the shortcomings of the prior art, a signal coupler pursuant to the present invention includes a transformer having a primary and a secondary winding. Each transformer winding has a pair of associated winding terminals. Each winding is also split at an intermediate winding position to form a pair of supplemental winding terminals. Circuitry is provided between each pair of supplemental winding terminals so as to provide different impedances in different frequency bands. In particular, a first circuit, which provides a first impedance in a first frequency range, is connected across the supplemental winding terminals of one winding. A second circuit is connected across the supplemental winding terminals of the other transformer winding. This second circuit, in combination with the first circuit or in combination with the transformer and the first circuit, provides a second impedance in a second frequency range. In the disclosed embodiment, the first circuit provides an impedance of 600 ohms in the voiceband frequency range. The second circuit, in combination with the first, provides an impedance of 100 ohms in a frequency range extending above 40 kHz.

DETAILED DESCRIPTION

Figure 1:
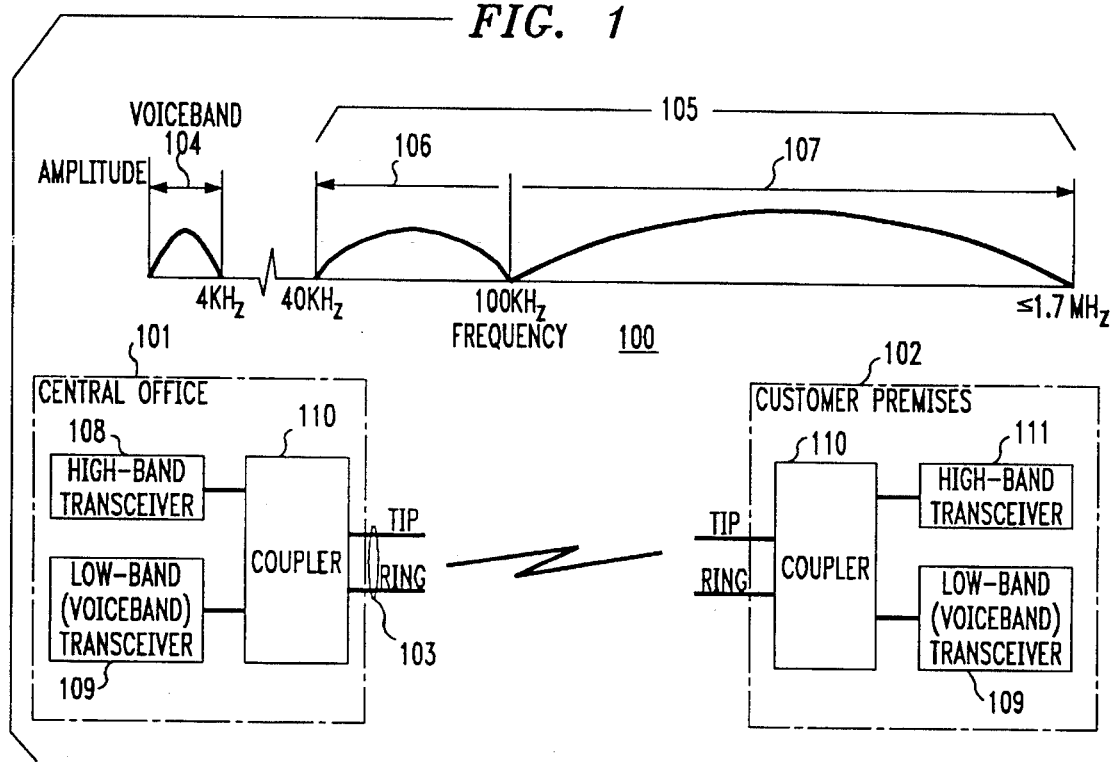
FIG. 1 is a block-schematic diagram of an illustrative communication system which incorporates the present invention.

In the illustrative communication system 100 shown in FIG. 1, which incorporates the present invention, both voice and data signals are communicated between central office 101 and customer premises 102 via communications path 103. In this embodiment, path 103 is a twisted pair of wires having tip and ring leads which extend between central office 101 and customer premises 102. The information rate for communications from the central office to the customer premises is greater than that from the customer premises to the central office. It is for this reason that communication system 100 is referred to as being asymmetrical. It is contemplated that asymmetrical systems will be widely used as one such system, referred to as the Asymmetric Digital Subscriber Loop (ADSL) system, is proposed for offering video communications to telephone customers via the public switched telephone network (PSTN).

As shown in FIG. 1, voice signals arc bidirectionally coupled between central office 101 and customer premises 102 via the tip and ring leads of communications path 103. Such voice signals are coupled in a first frequency band 104 extending from dc to 4 kHz. Data signals are also bidirectionally coupled between central office 101 and customer premises 102 via the tip and ring leads. The data signals are coupled in a second frequency band 105 which extends from 40 kHz up to 1.7 MHz. Band 105 is subdivided into two sub-bands 106 and 107. Sub-band 106 extends from 40 kHz to 100 kHz and is allocated for the data signals coupled from customer premises 102 to central office 101. Sub-band 107, on the other hand, extends from 100 kHz to 1.7 MHz and is allocated for data signals coupled from central office 101 to customer premises 102. To provide the above-described voice and data communication capabilities, central office 101 includes high-band transceiver 108, low-band transceiver 109, and coupler 110. Similarly, customer premises 102 includes low-band transceiver 109, coupler 110 and high-band transceiver 111. High-band transceivers 108 and 111 provide the bidirectional data communications, while the pair of low-band transceivers 109 provides the bidirectional voice communications. Note that the low-band transceiver located in the customer premises is identical to that located in the central office. The high-band transceivers in these locations, however, are different since the transmit and receiver frequencies are different for each of these locations. In actual applications, the low-band transceiver may not be located in central office 101 as shown in FIG. 1. Instead, this transceiver may be disposed at a location remote from the central office. The transceiver at this remote location is then interconnected via a conventional switching network to central office 101.

Figure 2:
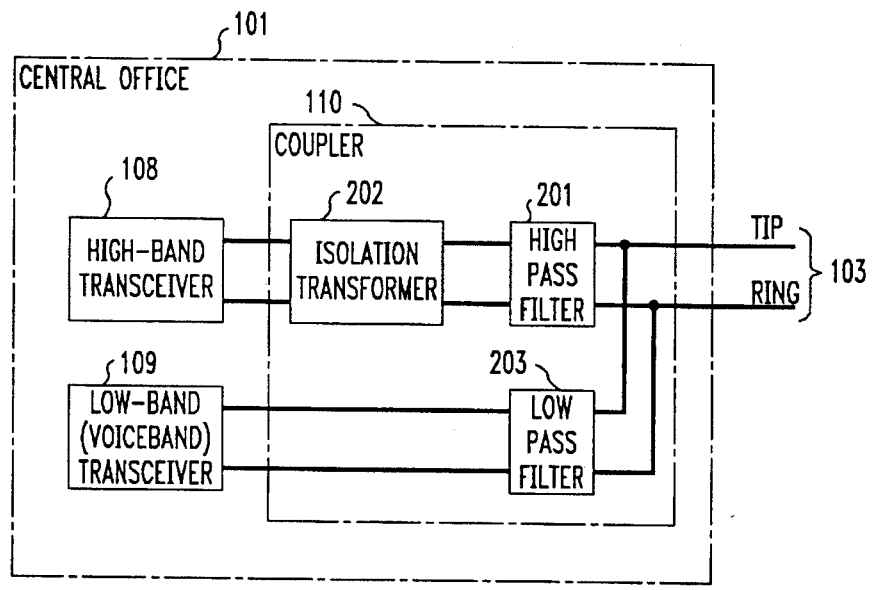
FIG. 2 is a block-schematic diagram of a prior art technique for providing the coupler shown in FIG. 1.

Refer now to FIG. 2. A prior art approach to implementing coupler 110 involves the use of an isolation transformer, a high-pass filter, and a low-pass filter. As shown, high-pass filter 201 is disposed between the tip and ring leads of communications path 103 and one winding of isolation transformer 202. The other winding of transformer 202 is connected to high-band transceiver 108 or 111. Low-pass filter 203 is also connected to the tip and ring leads of communications path 103 and serves as an interface device for low-band transceiver 109. While this arrangement may provide satisfactory results in some applications, it cannot meet the performance objectives required for communication system 100. More specifically, in communication system 100, it is necessary for the coupler to match the characteristic impedance of communication path 103 for both voice and data communications. This characteristic impedance changes in the two frequency bands 104 and 105. For voice communications in frequency band 104, the characteristic impedance of path 103 is about 600 ohms. For data communications in band 105, the characteristic impedance of path 103 is about 100 ohms. In the prior art arrangement shown in FIG. 2, the characteristic impedance provided by the coupler is the parallel combination of the high-pass filter 201 and the low-pass filter 203. That is, the characteristic impedance of the parallel combination, Z coupler, is given by $$1/Z_{coupler} = |1/Z_{high\ pass\ filter\ 201}| + |1/Z_{low\ pass\ filter\ 203}| \quad (1)$$

Equation (1) presents several difficulties for implementing a coupler for communication system 100. Specifically, when using the arrangement of FIG. 2 in system 100, the required 600 ohm impedance in band 104 and the required 100 ohm impedance in band 105 is a parallel combination of the impedances of high-pass filter 201 and low-pass filter 203. In band 104, the required 600 ohm impedance is provided by making the impedance of low-pass filter 203 equal to 600 ohms and by making the impedance of high-pass filter 201 very much greater than 600 ohms. In band 105, the required 100 ohm impedance is determined by making the impedance of high-pass filter 201 equal to 100 ohms and by making the impedance of low-pass filter 203 very much greater than 100 ohms. These impedance characteristics for filters 201 and 203 are difficult to achieve.

Figure 3:
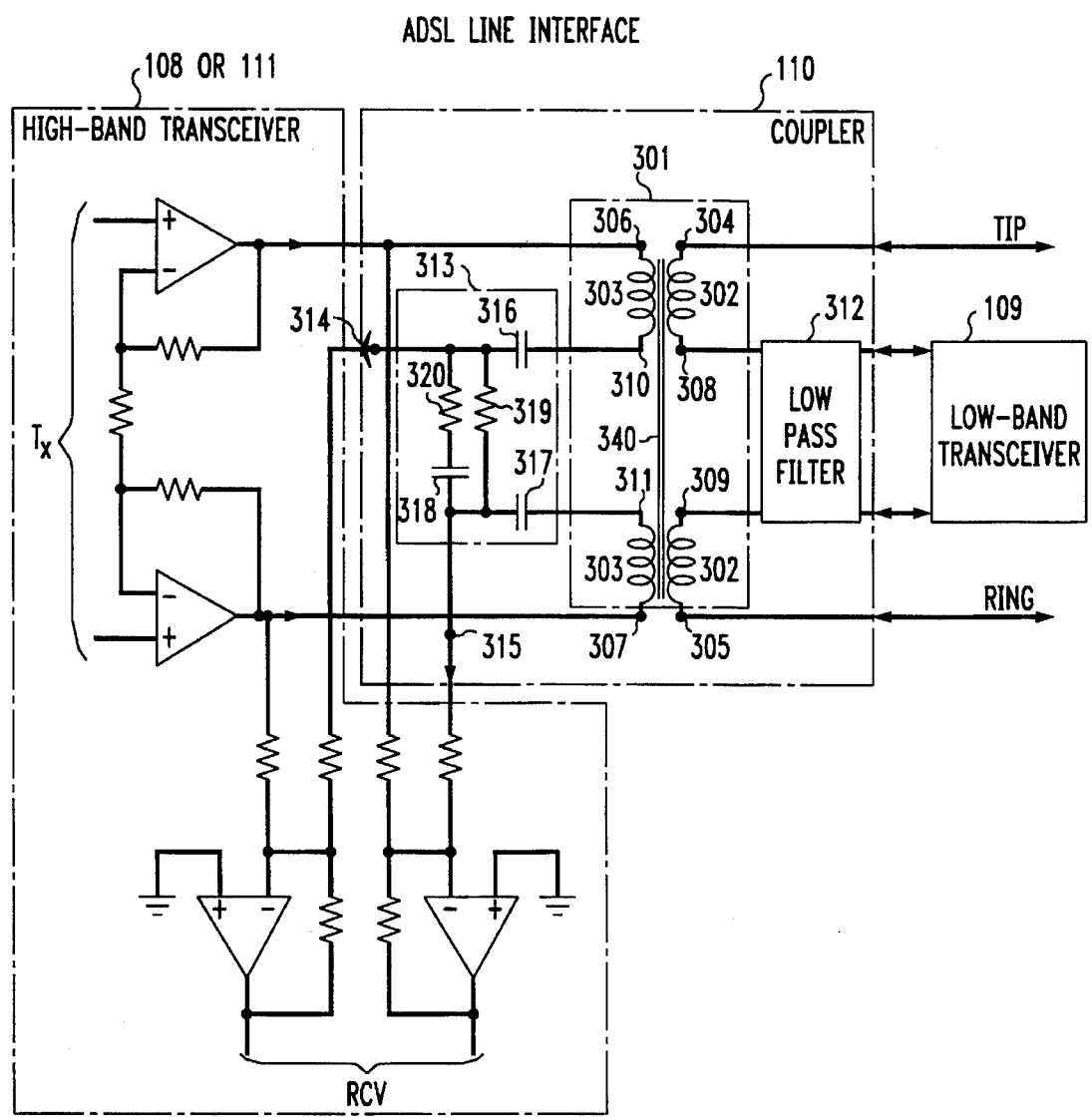
FIG. 3 is a block-schematic diagram of an embodiment of the present invention.
Figure 4:
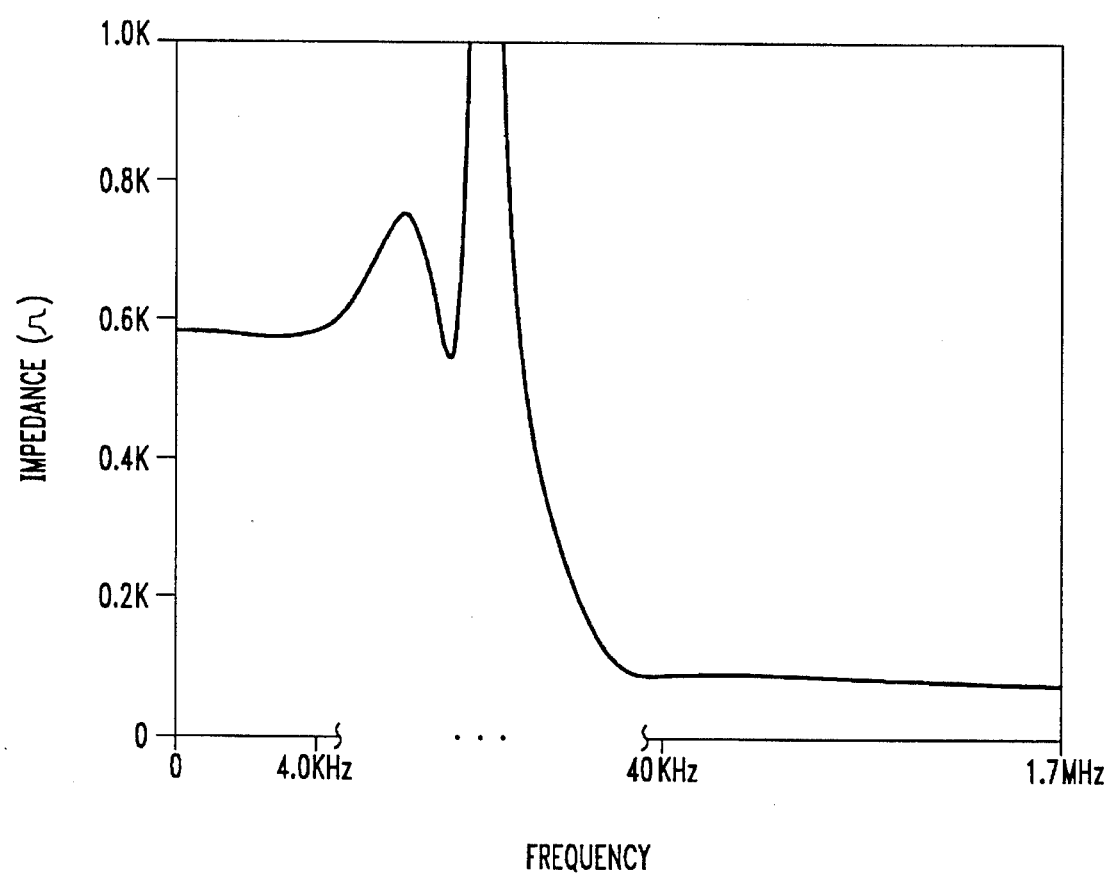
FIG. 4 is a plot of the impedance provided by the embodiment of FIG. 3 as a function of frequency.

FIG. 3 shows an embodiment of a coupler 110 pursuant to the present invention, and FIG. 4 is a plot of the impedance provided by this coupler as a function of frequency. As shown in FIG. 4, it will be noted that in the frequency range extending up to 4 kHz, an impedance of 600 ohms is provided, and in the frequency extending from 40 kHz, an impedance of 100 ohms is provided. The impedance provided in the band between 4 kHz and 40 kHz varies significantly, but in the disclosed communication system, this presents no problem, as there is no information coupled within this frequency band. Referring to FIG. 3, coupler 110 includes an isolation transformer 301 having a primary winding 302 and a secondary winding 303. Each of these windings has a pair of winding terminals. The turns ratio of the secondary to primary windings in transformer 301 is 1:1. This ratio is arbitrary and other ratios can be used. Furthermore, the designations of primary and secondary, relative to the windings of transformer 301, are also arbitrary. Reference numerals 304 and 305 designate the terminal ends of primary winding 302, while reference numerals 306 and 307 designate the terminal ends of secondary winding 303. In addition, the primary and secondary windings are each split at a predetermined intermediate position to form a pair of supplemental winding terminals. In the disclosed embodiment, this intermediate position is at the midpoint of both the primary and secondary windings. As a result, the impedance between terminals 304 and 308 is the same as that between terminals 309 and 305. The same is true for the secondary winding. That is, the impedance provided between terminals 306 and 310 is the same as that provided between terminals 311 and 307. Advantageously, this selection of the intermediate position maintains longitudinal balance, i.e., the impedance from the tip lead to ground and the impedance from the ring lead to ground are the same. In a twisted pair medium, longitudinal balance is desirable, as it eliminates the formation of differential signals in the tip and ring leads caused by common-mode interference signals. Reference numerals 308 and 309 designate the supplemental primary winding terminals, and 310 and 311 designate the supplemental secondary winding terminals. The magnetic core material 340, about which the primary and secondary windings are wrapped, is one continuous piece. The core material selected in the illustrative communication system 100 should have the capability of not saturating in the presence of loop currents in the tip and ring leads. Low-pass filter 312 is a four-terminal device having one pair of terminals connected to low-band transceiver 109 and another pair of terminals connected to the supplemental winding terminals 308 and 309. Circuit 313 is another four-terminal device having one pair of terminals, 314 and 315, connected to high-band transceiver 108 or 111, and another pair of terminals connected to supplemental secondary winding terminals 310 and 311. As will be described, low-pass filter 312 provides a first predetermined impedance in a first frequency band while circuit 313, in combination with low-pass filter 312, provides a second impedance in a second frequency band. The first and second impedances are different from one another and so, too, are the first and second frequency bands. In the disclosed embodiment, the low-pass filter provides a 600 ohm impedance in frequency band 104, extending from approximately 0 to 4 kHz while this filter, in combination with circuit 313, provides a 100 ohm impedance in frequency band 105, extending from approximately 40 kHz to 1.7 MHz. In preferred embodiment, it is advantageous to minimize the circuit elements required in circuit 313. This aim can be accomplished by utilizing the windings of transformer 301 as inductors in circuit 313. That is, the split primary and secondary windings for differential signals on tip and ring are equivalent to a pair of mutually-coupled inductors. Accordingly, in the preferred embodiment, circuit 313, in combination with the windings of transformer 301 and low-pass filter 312, provides a high-pass filter in frequency band 105.

Circuit 313 is a matching network which provides, in the disclosed embodiment, an impedance of 100 ohms in frequency band 105. This circuit includes capacitors 316, 317, 318 and resistors 319 and 320. Resistor 319 is connected across terminals 314 and 315 and is disposed in parallel with the series combination of resistor 320 and capacitor 318. Capacitor 316 is connected between terminals 310 and 314, and capacitor 317 is connected between terminals 311 and 315. The resistor 319, in parallel with the serial connection of resistor 320 and capacitor 318, provides the desired 100 ohm impedance.

Figure 5:
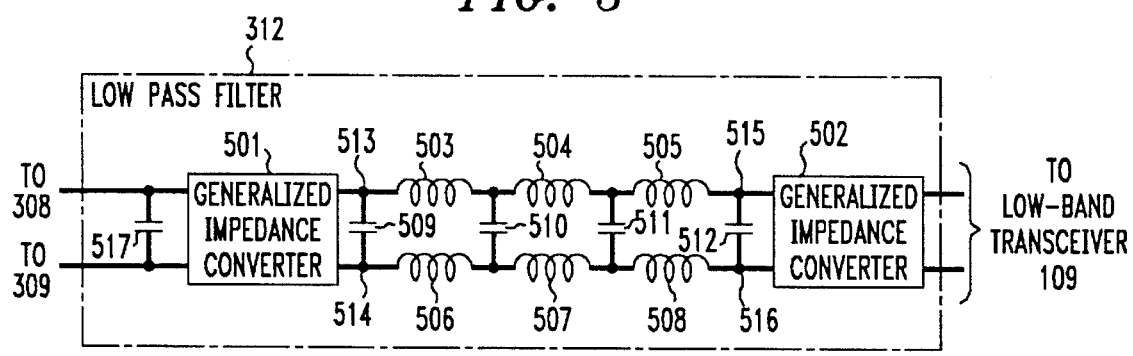
FIGS. 5, 6, and 7 are alternate illustrative embodiments of the low-pass filter shown in FIG. 3.
Figure 6:
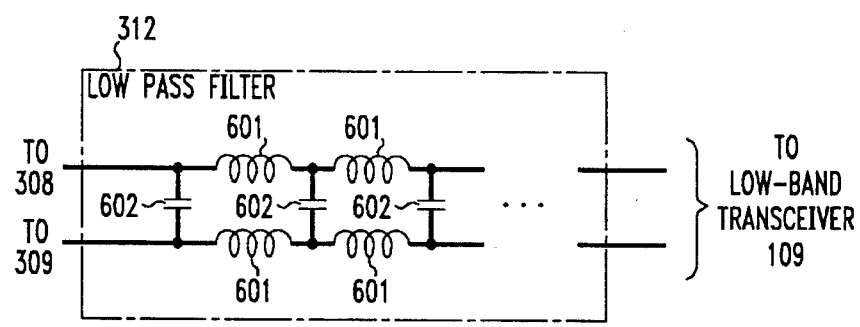
Figure 7:
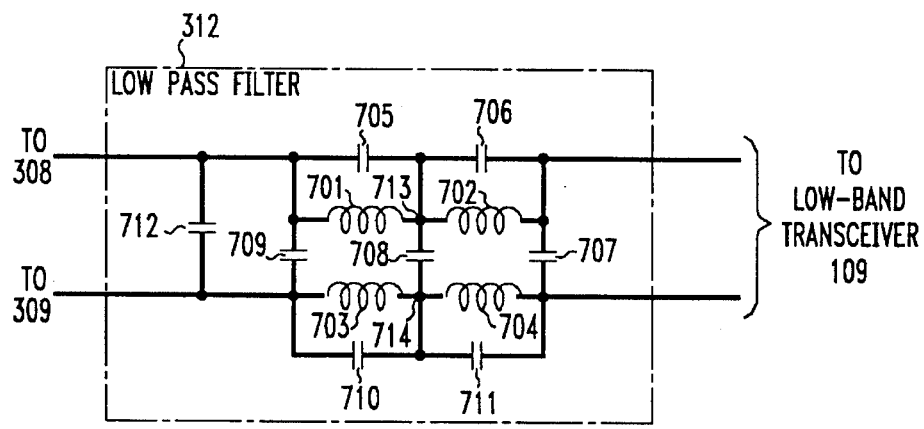

As shown in FIGS. 5–7, low-pass filter 312 can be implemented in a variety of ways. As shown in FIG. 5, filter 312 includes a pair of generalized impedance converters 501 and 502. Each of these converters is a four-terminal device. One pair of these terminals is connected to the supplemental primary winding terminals, i.e., 308 and 309, while the second pair of terminals, designated as 513 and 514, is connected to a first end of the ladder network. One pair of the terminals of converter 502 is connected to the low-band transceiver 109 and the other pair of terminals, designated as 515 and 516, is connected to a second end of the ladder network. The ladder network includes inductors 503–508 and capacitors 509–512. Inductors 503–505 are serially connected and so, too, are inductors 506-508. Capacitor 509 is connected between terminals 513 and 514 of generalized impedance converter 501, while capacitor 512 is connected across terminals 515 and 516 of generalized impedance converter 502. Capacitors 510 and 511 are connected between the nodes formed between two serially-connected inductors. Circuit 312 also includes capacitor 517 which is connected between supplemental primary winding terminals 308 and 309. Another implementation of filter 312 can be provided by the ladder network shown in FIG. 6. This ladder network includes two "rails" and a plurality of "rungs". The length of the rails can be varied by altering the number of inductors 601 which are serially connected to form each rail. Each rung of the ladder interconnects two rails and is formed by a capacitor 602. Finally, filter 312 can be realized, as shown in FIG. 7, using an interconnection of inductors and capacitors. This interconnection can also be described as being a ladder network wherein each rail is made of a serial connection of inductors which, in turn, is disposed in parallel with a serial connection of capacitors. Referring to FIG. 7, one rail includes the serial connection of inductors 701 and 702 disposed in parallel with the serial connection of capacitors 705 and 706. The second rail is formed by the serial connection of inductors 703 and 704 which, in turn, is disposed in parallel with the serial connection of capacitors 710 and 711. With these two rails, there are three rungs. The first of these rungs is formed by the connection of capacitor 707 across one end of each rail and the second of these rungs is formed by the connection of capacitor 709 across another end of each rail. The third rung is formed by the interconnection of capacitor 708 across a node 713 formed by the interconnection of inductors 701 and 702 and another node 714 formed by the interconnection of inductors 703 and 704. In FIG. 7, circuit 312 also includes a capacitor 712 interconnected between supplemental primary winding terminals 308 and 309. In the arrangements shown in FIGS. 5 through 7, it is the capacitor 517 in FIG. 5, the left-most capacitor 602 in FIG. 6, and the parallel combination of capacitors 709 and 712 in FIG. 7, which primarily determine the input impedance of low-pass filter 312 in frequency band 105.

It should, of course, be noted that while the present invention has been described in reference to illustrative embodiments, other arrangements may be apparent to those of ordinary skill in the art. For example, while the disclosed embodiments utilize discrete devices, these devices can be implemented using one or more appropriately programmed processors, special-purpose integrated circuits, digital processors, or an analog or hybrid counterpart of any of these devices. Or, for example, while communications path 103 in the disclosed embodiment is a twisted pair cable, the present invention can be used with other types of wire communications medium, such as coaxial cable and shield twisted pair. Moreover, while path 103 in the disclosed embodiment is a continuous twisted pair extending between central office 101 and customer premises 102, the present invention is also applicable in applications where one or more non-wire mediums is disposed between a twisted pair connection immediately adjacent to central office 101 and another twisted pair connection immediately adjacent to customer premises 102. Such non-wire mediums include optical fiber and radio links (cellular and non-cellular). Finally, for example, while circuit 313 in the disclosed embodiment is a particular matching network, other configurations are possible. The arrangement of resistor 319 in parallel with the serial combination of resistor 320 and capacitor 318 could be replaced by a single resistor. Alternatively, a serial combination of resistor and capacitor connected at one end to a parallel combination of another resistor and capacitor could be substituted for the arrangement of resistors 319, 320, and capacitor 318 shown in FIG. 3.

What is claimed:

1. A signal coupler comprising:
   (a) a transformer having
      (i) a first primary winding having a first inductance, a first terminal and a second terminal;
      (ii) a second primary winding having a second inductance, a first terminal and a second terminal,
      (iii) a first secondary winding having a third inductance, a first terminal and a second terminal, and
      (iv) a second secondary winding having a fourth inductance, a first terminal and a second terminal,
   (b) a first circuit connected to the first terminal of the first primary winding and the first terminal of the second primary winding for providing a first impedance in a first frequency range across the second terminal of the first primary winding and the second terminal of the second primary winding, and
   (c) a second circuit connected to the first terminal of the first secondary winding, and the first terminal of the second secondary winding, said second circuit, in combination with said first circuit, providing a second impedance in a second frequency range across the second terminal of the first primary winding and the second terminal of the second primary winding, said first and second impedances being different from one another and said first and second frequency ranges being different from one another; said second circuit providing a third impedance in the second frequency range across the second terminal of the first secondary winding and the second terminal of the second secondary winding.

2. The coupler of claim 1 wherein said first impedance is substantially 600 ohms and said first frequency range is substantially equivalent to a voice bandwidth.

3. The coupler of claim 1 wherein said second impedance is substantially 100 ohms and said second frequency range extends from approximately 40 kHz to a predetermined frequency substantially greater than 40 kHz.

4. The coupler of claim 1 wherein said first impedance is substantially 600 ohms, said first frequency range extends from approximately 0 to 4 kHz, said second impedance is substantially 100 ohms and said second frequency range extends from approximately 40 kHz to a predetermined frequency substantially greater than 40 kHz.

5. The coupler of claim 1 wherein a voice signal in said first frequency range and a data signal in said second frequency range are both applied across the second terminal of the first primary winding and the second terminal of the second primary winding.

6. The signal coupler of claim 1 wherein said second circuit further in combination with said first circuit and said transformer provides a high-pass filter.

7. The coupler of claim 1 wherein said first primary winding has substantially the same inductance as said second primary winding, and said first secondary winding has substantially the same inductance as said second secondary winding, so longitudinal balance is maintained.

8. The coupler of claim 1 wherein said first circuit is connected to a transceiver for processing signals in said first frequency range.

9. The coupler of claim 8 wherein said second circuit is connected to another transceiver for processing signals in said second frequency range.

10. The coupler of claim 9 wherein said transceiver processes voice signals and said another transceiver processes data signals.

* * * * *